(12) United States Patent
Lu

(10) Patent No.: US 10,438,885 B1
(45) Date of Patent: Oct. 8, 2019

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/015,025

(22) Filed: Jun. 21, 2018

(51) Int. Cl.
*H01L 23/498* (2006.01)
*H01L 23/538* (2006.01)
*H01L 21/48* (2006.01)

(52) U.S. Cl.
CPC ...... *H01L 23/49838* (2013.01); *H01L 21/481* (2013.01); *H01L 21/486* (2013.01); *H01L 21/4853* (2013.01); *H01L 21/4857* (2013.01); *H01L 23/49822* (2013.01); *H01L 23/5383* (2013.01); *H01L 23/5386* (2013.01); *H01L 23/49894* (2013.01)

(58) Field of Classification Search
CPC .............. H01L 23/49838; H01L 21/481; H01L 21/486; H01L 21/4857; H01L 21/4853; H01L 23/5386; H01L 23/5383; H01L 23/49822; H01L 23/49894
See application file for complete search history.

(56) References Cited

U.S. PATENT DOCUMENTS

| | | | |
|---|---|---|---|
| 7,161,242 B2 | 1/2007 | Yamasaki et al. | |
| 8,830,689 B2 | 9/2014 | Kim et al. | |
| 9,066,435 B2 | 6/2015 | Terui et al. | |
| 9,837,342 B2 | 12/2017 | Sakamoto | |
| 9,893,016 B2 | 2/2018 | Sakamoto et al. | |
| 2012/0161331 A1* | 6/2012 | Gonzalez ................ | H01L 24/19 257/774 |
| 2014/0347837 A1 | 11/2014 | Kariya et al. | |

* cited by examiner

*Primary Examiner* — David Vu
(74) *Attorney, Agent, or Firm* — Foley & Lardner LLP; Cliff Z. Liu

(57) ABSTRACT

A semiconductor device package includes a first dielectric layer, a first conductive layer, an electronic component, a second dielectric layer, a second conductive layer and a package body. The first dielectric layer has a top surface, a bottom surface opposite to the top surface and a lateral surface extending between the top surface and the bottom surface. The first conductive layer is disposed on the top surface of the first dielectric layer. The electronic component is disposed on the top surface of the first dielectric layer. The second dielectric layer covers the bottom surface and a first portion of the lateral surface of the first dielectric layer and exposes a second portion of the lateral surface of the first dielectric layer. The second conductive layer is disposed on a bottom surface of the second dielectric layer and electrically connected to the first conductive layer. The package body covers the electronic component, the top surface of the second dielectric layer and the second portion of the lateral surface of the first dielectric layer.

20 Claims, 22 Drawing Sheets

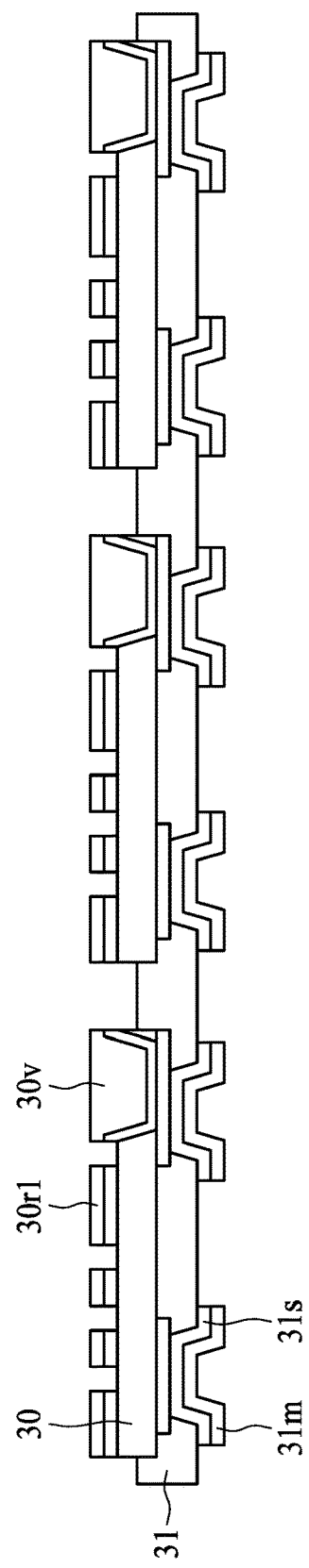
FIG. 3G"

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same. More particularly, the present disclosure relates to a semiconductor device package including a conductive pillar structure and a method of manufacturing the same.

2. Description of the Related Art

In some processes to form a connection structure (e.g., a fan-out structure) of a semiconductor device package, a circuit layer with fine-pitch conductive traces (e.g., a line space (L/S) equal to or less than 7 micrometer (μm)/7 μm) on one side (e.g., chip-side) of the circuit layer is placed on a carrier and then coarse-pitch conductive traces are formed on the other side (e.g., ball-side) of the circuit layer. However, due to the misalignment (x-direction and y-direction) and the leveling error (z-direction), the conductive traces would not be accurately formed on the circuit layer, which would result in electrical problems (e.g., short or open).

In other processes to form the connection structure, the coarse-pitch conductive traces can be formed on the ball-side of the circuit layer and then the fine-pitch conductive traces are formed on the chip-side of the circuit layer. However, due to the warpage issue, it is difficult to form the conductive traces on the chip-side of the circuit layer.

SUMMARY

In one or more embodiments, a semiconductor device package includes a first dielectric layer, a first conductive layer, an electronic component, a second dielectric layer, a second conductive layer and a package body. The first dielectric layer has a top surface, a bottom surface opposite to the top surface and a lateral surface extending between the top surface and the bottom surface. The first conductive layer is disposed on the top surface of the first dielectric layer. The electronic component is disposed on the top surface of the first dielectric layer. The second dielectric layer covers the bottom surface and a first portion of the lateral surface of the first dielectric layer and exposes a second portion of the lateral surface of the first dielectric layer. The second conductive layer is disposed on a bottom surface of the second dielectric layer and electrically connected to the first conductive layer. The package body covers the electronic component, the top surface of the second dielectric layer and the second portion of the lateral surface of the first dielectric layer.

In one or more embodiments, a semiconductor device package includes a first circuit layer, a second circuit layer, an electronic component and a package body. The first circuit layer has a first dielectric layer and a first conductive layer. The second circuit layer has a second dielectric layer covering at least a portion of the first dielectric layer and a second conductive layer electrically connected to the first conductive layer. The electronic component is disposed on the first circuit layer. The package body covers the electronic component, the first circuit layer and the second circuit layer. The first dielectric and the second dielectric satisfy the following inequation: $0<|A-B|\leq 1$ μm, where A is a maximum distance between a lateral surface of the first dielectric layer and a lateral surface of the second dielectric layer and B is a minimum distance between the lateral surface of the first dielectric layer and the lateral surface of the second dielectric layer.

In one or more embodiments, a method for manufacturing a semiconductor device package includes (a) providing a first carrier; (b) disposing a photosensitive material on the first carrier; (c) exposing and developing the photosensitive material and removing a portion of the photosensitive material to form a first circuit layer, the first circuit layer defining a recess; (d) forming a dielectric layer on the first circuit layer and within the recess; and (e) forming a second circuit layer on the dielectric layer and electrically connected to the first circuit layer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
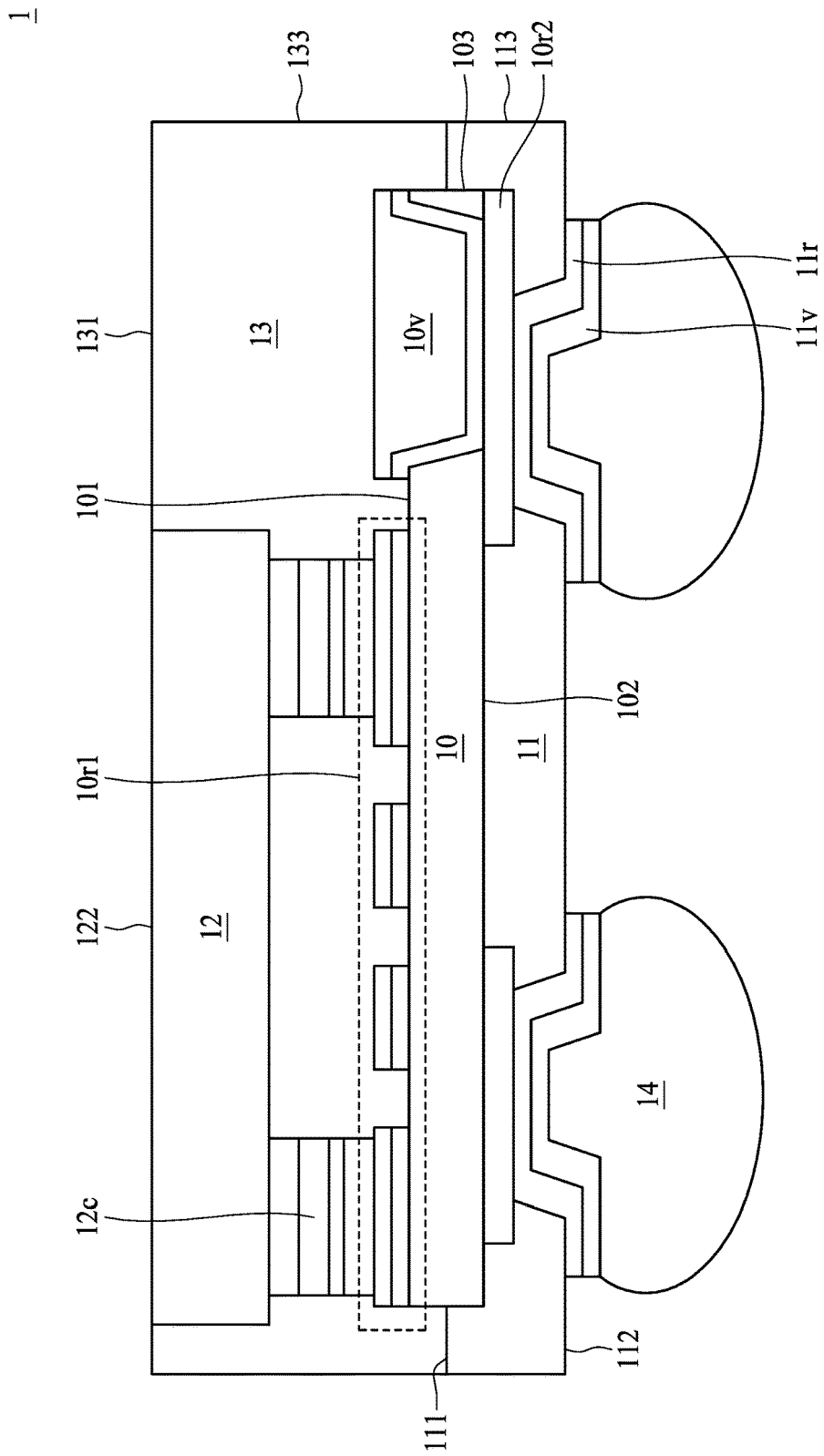
FIG. 1A illustrates a cross-sectional view of a semiconductor device package in accordance with some embodiments of the present disclosure.

FIG. 1A illustrates a cross-sectional view of a semiconductor device package 1 in accordance with some embodiments of the present disclosure. The semiconductor device package 1 includes dielectric layers 10 and 11, an electronic component 12, a package body 13 and an electrical contact 14.

The dielectric layer 10 has a surface 101 (also referred to as "a top surface"), a surface 102 (also referred to as "a bottom surface") opposite to the surface 101 and a surface 103 (also referred to as "a lateral surface") extending between the surface 101 and the surface 102. One or more conductive layers 10r1 are disposed on the surface 101 of the dielectric layer 10. One or more conductive layers 10r2 are disposed on the surface 102 of the dielectric layer 10. In some embodiments, a conductive via 10v penetrates the dielectric layer 10 to provide electrical connections between the surface 101 of the dielectric layer 10 and the surface 102 of the dielectric layer 10. For example, the conductive via 10v may electrically connect the conductive layer 10r1 to the conductive layer 10r2. In some embodiments, the conductive via 10v tapers in a direction from the surface 101 toward the surface 102 (or in a direction away from the electronic component 12). In some embodiments, the conductive layer 10r1 includes a plurality of conductive traces, and a line space (L/S) of the conductive traces is equal to or less than 2 micrometer (μm)/2 μm. In some embodiments, the conductive layer 10r2 includes a plurality of conductive traces, and a L/S of the conductive traces is equal to or greater than 5 μm/5 μm. In some embodiments, a thickness of the dielectric layer 10 is in a range from about 5 μm to about 10 μm. In some embodiments, the dielectric layer 10 and the conductive layer 10r1 and the conductive via 10v can be collectively referred to as a circuit layer.

The dielectric layer 11 covers the surface 102 of the dielectric layer 10 and a portion of the surface 103 of the dielectric layer 10. For example, the dielectric layer 11 may cover a first portion of the surface 103 of the dielectric layer 10 and expose a second portion of the surface 103 of the dielectric layer 10. For example, a surface 111 (also referred to as "a top surface") of the dielectric layer 11 is not coplanar with the surface 101 of the dielectric layer 10. For example, the surface 111 of the dielectric layer 11 and the surface 101 of the dielectric layer 10 are discontinuous. One or more conductive layers 11r are disposed on a surface 112 (also referred to as "a bottom surface") of the dielectric layer 11. In some embodiments, a conductive via 11v penetrates the dielectric layer 11 to electrically connect the conductive layer 11r to the conductive layer 10r2. In some embodiments, the conductive via 11v tapers in a direction from the surface 111 toward the surface 112 (or in a direction toward the electronic component 12). In some embodiments, a thickness of the dielectric layer 11 is in a range from about 10 μm to about 30 μm. In some embodiments, the dielectric layer 11 and the conductive layer 11r and the conductive via 11v can be collectively referred to as a circuit layer. In some embodiments, the semiconductor device package 1 may include any number of circuit layers. For example, the semiconductor device package 1 may include N circuit layers, where N is an integer greater than 1.

In some embodiments, the conductive layer 10r1, 10r2 or 11r is formed of or includes gold (Au), silver (Ag), copper (Cu), platinum (Pt), Palladium (Pd), other metal(s) or alloy(s), or a combination of two or more thereof. In some embodiments, the dielectric layer 10 or the dielectric layer 11 may include molding compounds, pre-impregnated composite fibers (e.g., pre-preg), Borophosphosilicate Glass (BPSG), silicon oxide, silicon nitride, silicon oxynitride, Undoped Silicate Glass (USG), glass, ceramic, any combination of two or more thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, the dielectric layer 10 and the dielectric layer 11 include the same material. Alternatively, the dielectric layer 10 and the dielectric layer 11 may include different materials. In some embodiments, the dielectric layer 10 includes a photosensitive material. In some embodiments, the conductive layer 10r1 can be formed by lithographic techniques.

The electronic component 12 is disposed on the surface 101 of the dielectric layer 10 and electrically connected to the conductive layer (or conductive pad) 10r1 on the surface 101 of the dielectric layer 10 through a conductive contact 12c (e.g., a micro-bump). In some embodiments, a chip backside layer (not shown) may be disposed on a backside surface 122. In some embodiments, the chip backside layer may include Cu, Ni, Ti, W or Pt, other metal(s) or alloy(s), or a combination of two or more thereof. In other embodiments, the chip backside layer may include PI, ABF, epoxy, CPD or solder mask. The electronic component 12 may include a chip or a die including a semiconductor substrate, one or more integrated circuit devices, and/or one or more overlying interconnection structures disposed therein. The integrated circuit devices may include active devices such as transistors and/or passive devices such resistors, capacitors, inductors, or a combination of two or more thereof. In some embodiments, there may be any number of electronic components disposed on the surface 101 of the dielectric layer 10 depending on design specifications.

The package body 13 is disposed on the dielectric layer 10 and the dielectric layer 11. The package body 13 covers the surface 101, a portion (e.g., the second portion) of the surface 103 of the dielectric layer 10 that is exposed from the dielectric layer 11, the surface 111 of the dielectric layer 11 and the electronic component 12. For example, an interface between the package body 13 and the dielectric layer 11 is located on or adjacent to the surface 103 of the dielectric layer 10, which would avoid cracking or delamination at the interface. In some embodiments, a surface 131 of the package body 13 is substantially coplanar with a backside surface 122 of the electronic component 12. For example, the backside surface 122 of the electronic component 12 is exposed from the package body 13. Alternatively, the package body 13 may cover the backside surface 122 of the electronic component 12. In some embodiments, a surface 133 of the package body 13 is substantially coplanar with a surface 113 of the dielectric layer 11. In some embodiments, the package body 13 includes, for example, one or more organic materials (e.g., a molding compound, bismaleimide triazine (BT), a PI, a polybenzoxazole (PBO), a solder resist, an ABF, a polypropylene (PP), an epoxy-based material, or a combination of two or more thereof), inorganic materials (e.g., silicon, a glass, a ceramic, a quartz, or a combination of two or more thereof), a liquid-film material or a dry-film material, or a combination of two or more thereof. In some embodiments, the package body 13 may be a dispensing gel. In some embodiments, a thickness of the package body 13 is in a range from about 100 μm to about 350 μm.

The electrical contact 14 is disposed on the surface 112 of the dielectric layer 11 and electrically connected to the conductive layer 11r or the conductive via 11v. In some embodiments, the electrical contact 14 is a Controlled Collapse Chip Connection (C4), a Ball Grid Array (BGA), a Land Grid Array (LGA) or a bump. In some embodiments, the electrical contact 14 can be used for a fan-in structure, a fan-out structure or a combination of the fan-in and fan-out structure. In some embodiments, a diameter of the electrical contact 14 is in a range from about 0.2 millimeter (mm) to about 0.3 mm.

Figure 1B:
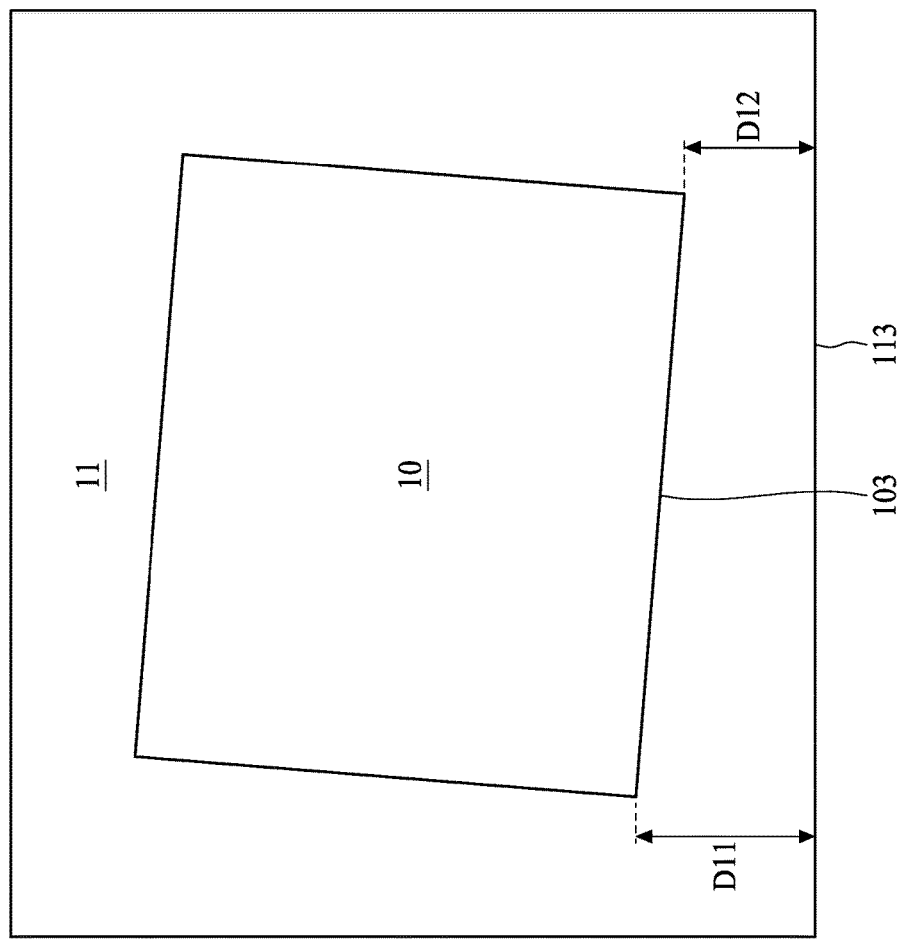
FIG. 1B illustrates a top view of the semiconductor device package in FIG. 1A in accordance with some embodiments of the present disclosure.

FIG. 1B illustrates a top view of the semiconductor device package 1 in accordance with some embodiments of the present disclosure. In some embodiments, due to the process constraint by lithographic techniques, the lateral surface (e.g., surface 103) of the dielectric layer 10 may not be parallel to the lateral surface (e.g., surface 113) of the dielectric layer 11. For example, the distance between the surface 103 of the dielectric layer 10 and the surface 113 of the dielectric layer 11 may vary. In some embodiments, the distance between the surface 103 of the dielectric layer 10 and the surface 113 of the dielectric layer 11 satisfies the following inequation:

$$0 < |D11 - D12| \leq 2 \ \mu m,$$

where D11 is the maximum distance between the surface 103 of the dielectric layer 10 and the surface 113 of the dielectric layer 11 and D12 is the minimum distance between the surface 103 of the dielectric layer 10 and the surface 113 of the dielectric layer 11.

In some other processes for forming a connection structure (e.g., a fan-out structure) of a semiconductor device package, a circuit layer with fine-pitch conductive traces (e.g., a line space (L/S) equal to or less than 7 micrometers (μm)/7 μm) on one side (e.g., chip-side) of the circuit layer is placed on a carrier and then coarse-pitch conductive traces are formed on the other side (e.g., ball-side) of the circuit layer. However, due to the constraint of the accuracy of the bonder (or bonding machine), the misalignment in the x-direction and/or the y-direction would be greater than 2 μm, which would cause electrical problems for conductive wires (e.g., short or open), especially when the pitch of conductive traces scales down (e.g., L/S equal to or less than 7 μm/7 μm). In accordance with the embodiments in FIG. 1A and FIG. 1B, since the conductive traces (e.g., conductive layer 10r1) is formed by lithographic techniques, the maximum misalignment in the x-direction and/or the y-direction is equal to or less than 1 μm, which would facilitate the formation of fine-pitch conductive traces.

Figure 2A:
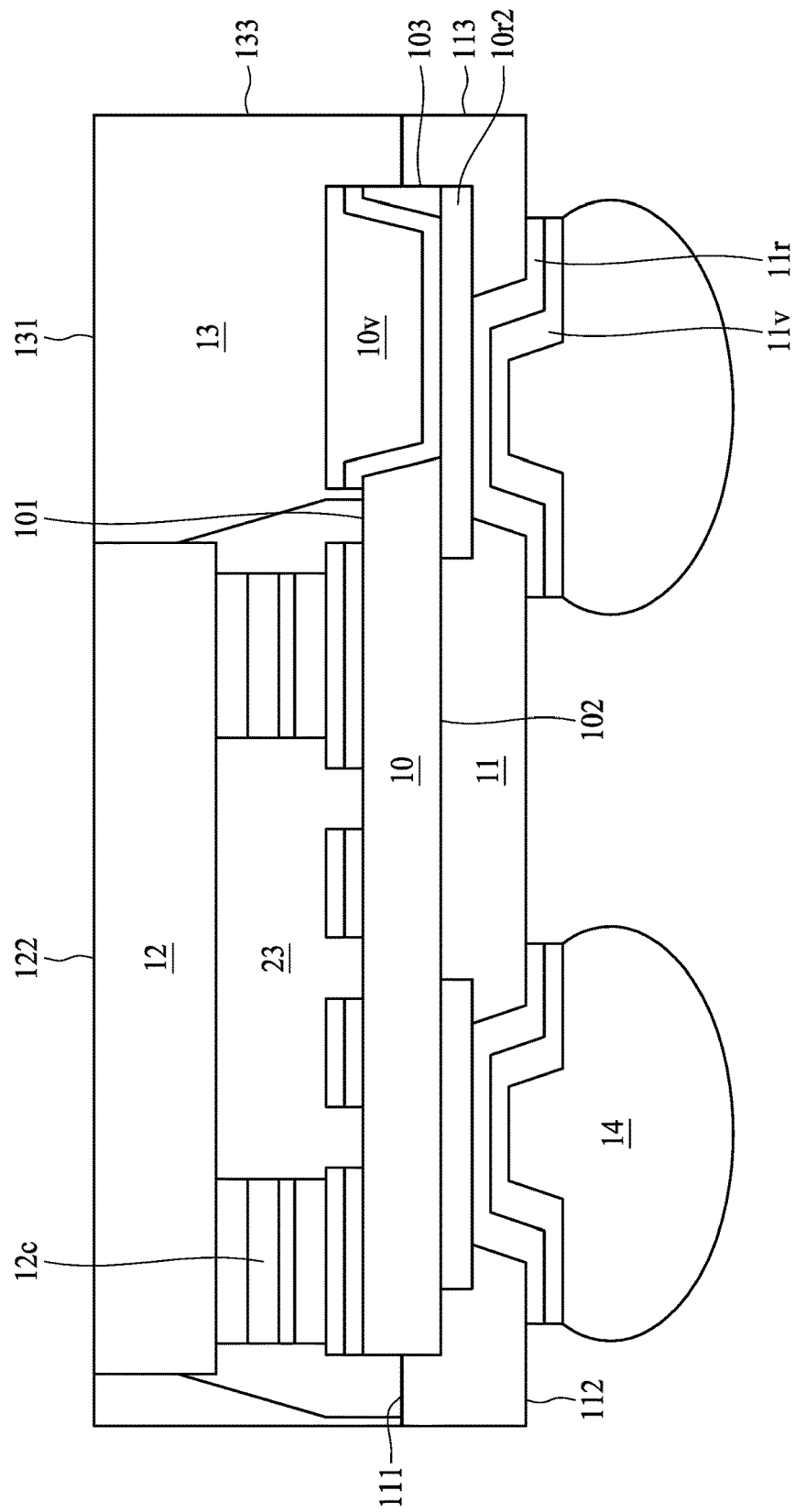
FIG. 2A illustrates a cross-sectional view of a semiconductor device package in accordance with some embodiments of the present disclosure.

FIG. 2A illustrates a cross-sectional view of a semiconductor device package 2A in accordance with some embodiments of the present disclosure. The semiconductor device package 2A is similar to the semiconductor device package 1 in FIG. 1A except that the semiconductor device package 2A further includes an underfill 23 between the electronic component 12 and the dielectric layers 10 and 11. In some embodiments, the underfill 23 includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 23 may be a capillary underfill (CUF), a molded underfill (MUF) or a dispensing gel, depending on specifications of different embodiments.

Figure 2B:
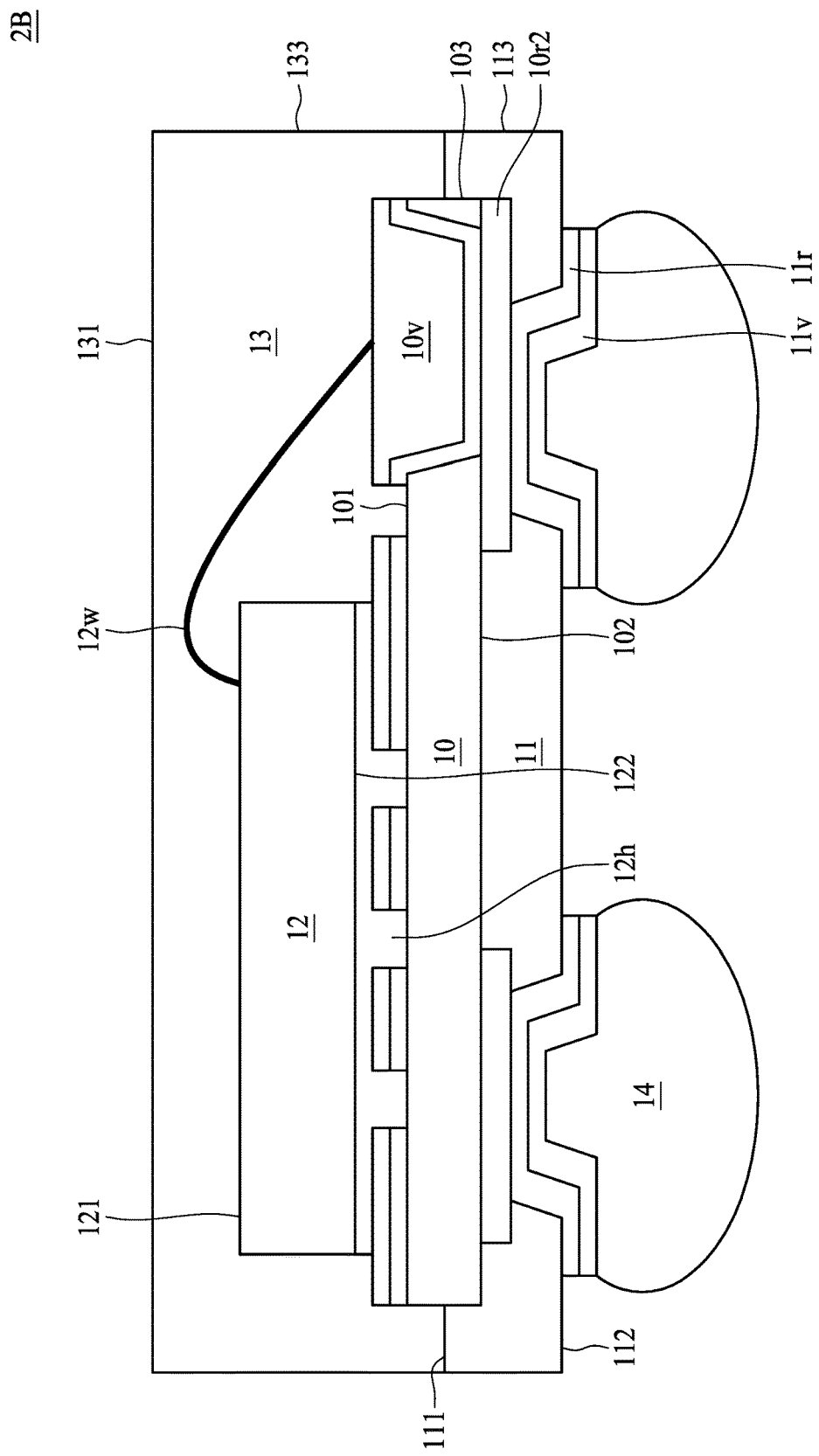
FIG. 2B illustrates a cross-sectional view of a semiconductor device package in accordance with some embodiments of the present disclosure.

FIG. 2B illustrates a cross-sectional view of a semiconductor device package 2B in accordance with some embodiments of the present disclosure. The semiconductor device package 2B is similar to the semiconductor device package 1 in FIG. 1A except that in FIG. 2B, the backside surface 122 of the electronic component 12 is attached to the dielectric layer 10 through an adhesive layer 12h (e.g., a glue or tape) while an active surface 121 of the electronic component 12 is electrically connected to the conductive traces or conductive via 10v through a bonding wire 12w.

Figure 2C:
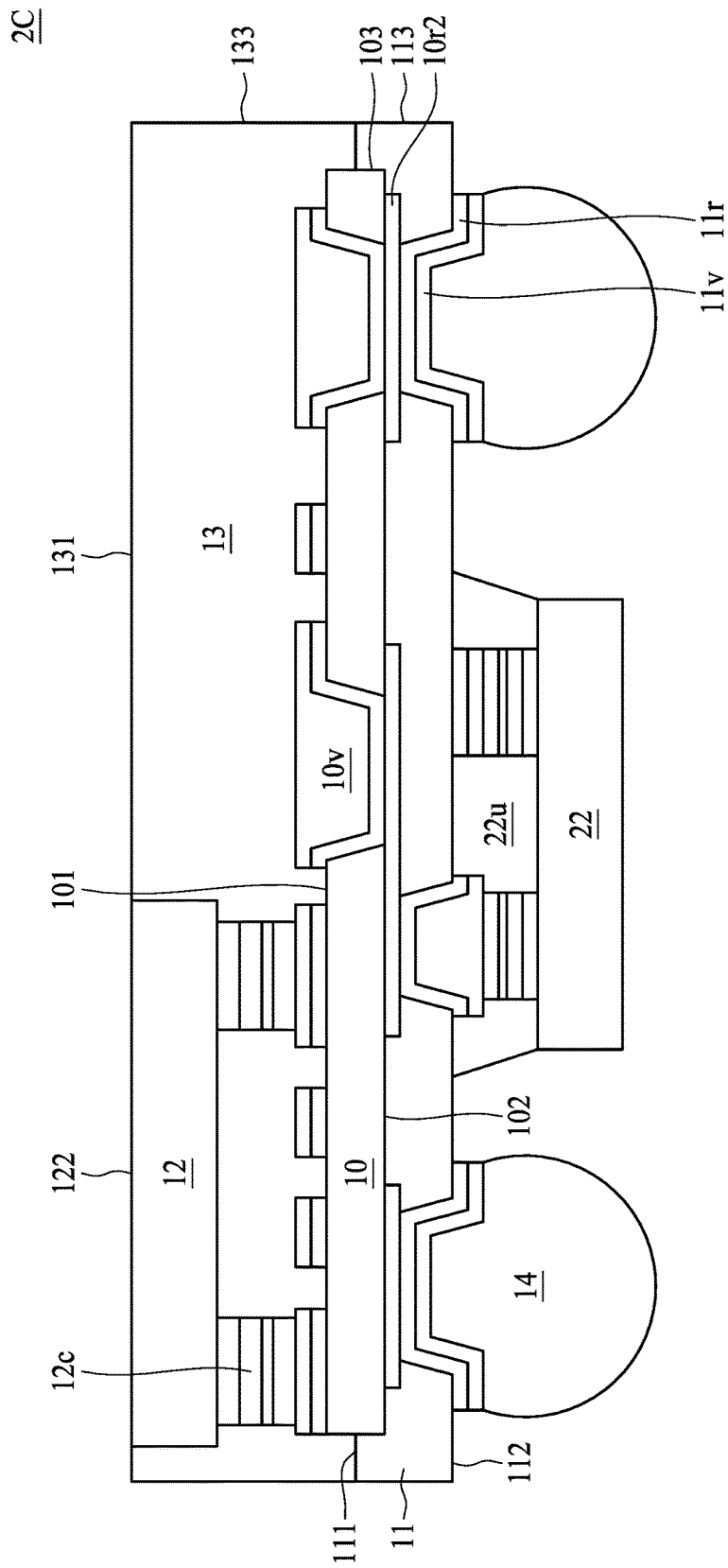
FIG. 2C illustrates a cross-sectional view of a semiconductor device package in accordance with some embodiments of the present disclosure.

FIG. 2C illustrates a cross-sectional view of a semiconductor device package 2C in accordance with some embodiments of the present disclosure. The semiconductor device package 2C is similar to the semiconductor device package 1 in FIG. 1A except that the semiconductor device package 2C further includes an electronic component 22 disposed on the surface 112 of the dielectric layer 11 and electrically connected to the conductive traces on the surface 112 of the dielectric layer 11. In some embodiments, the semiconductor device package 2C may further include an underfill 22u between the electronic component 22 and the dielectric layer 11.

Figure 4A:
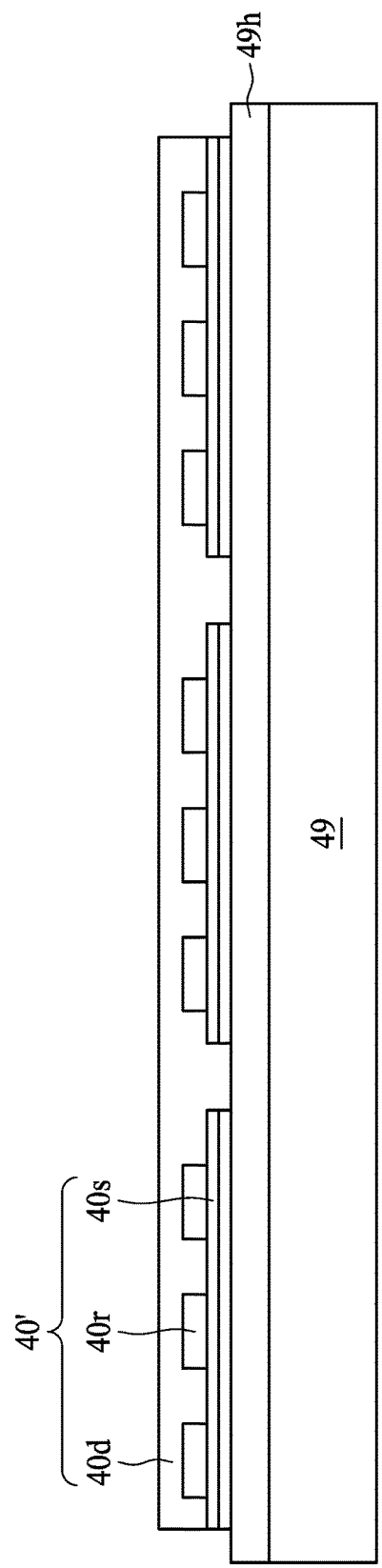
FIG. 4A, FIG. 4B, FIG. 4C, FIG. 4D and FIG. 4E illustrate a method of manufacturing a semiconductor device package in accordance with some embodiments of the present disclosure.
Figure 4B:
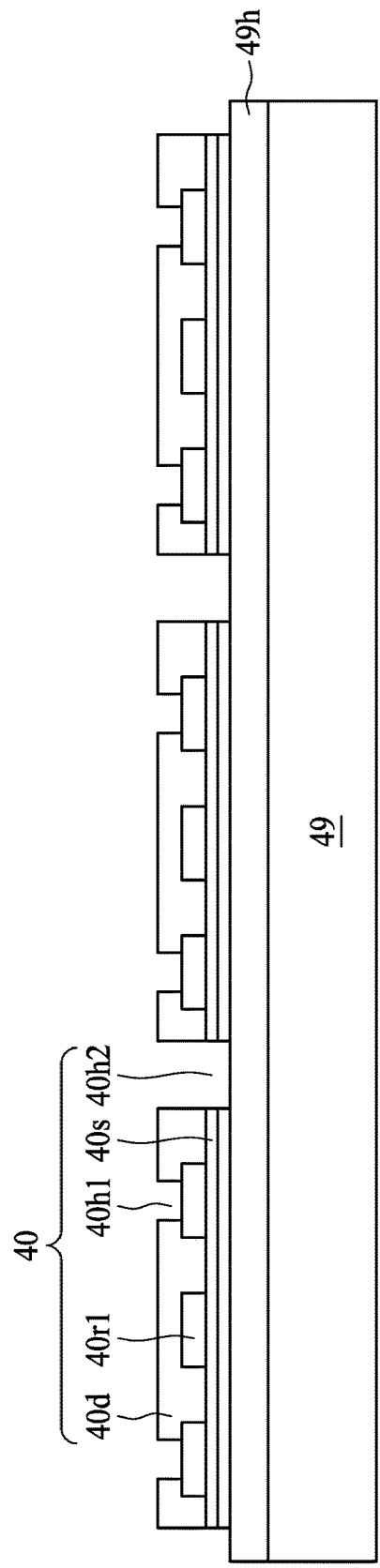
Figure 4C:
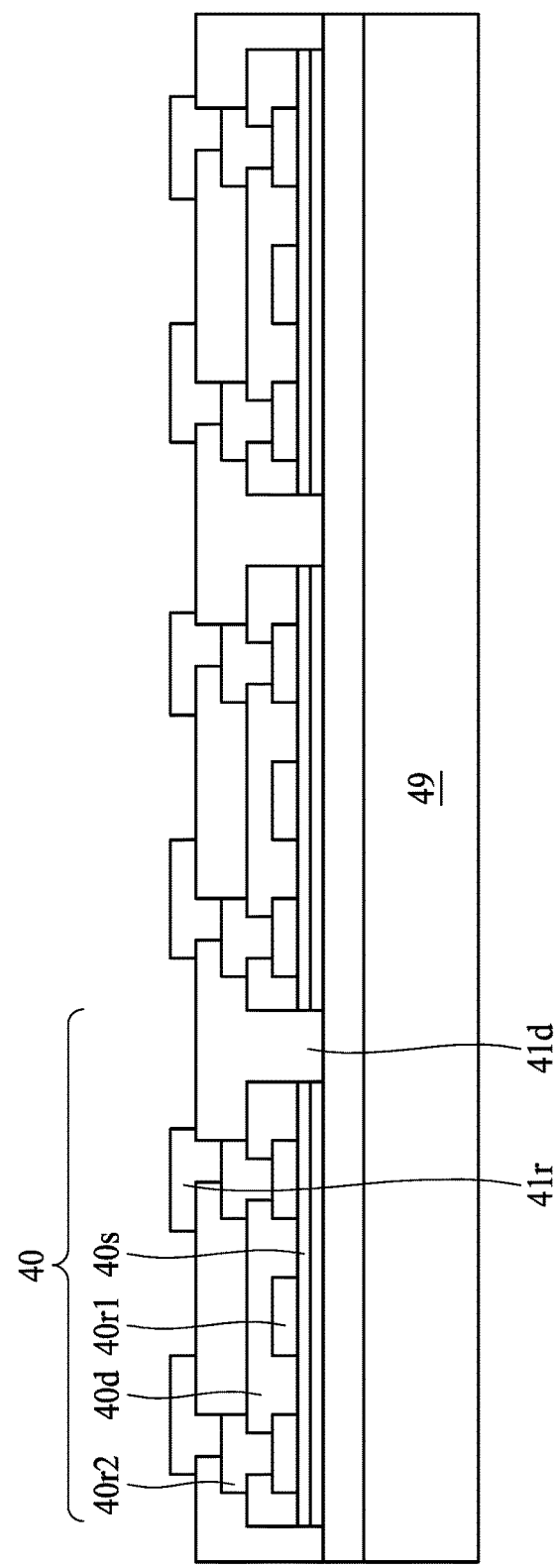
Figure 4D:
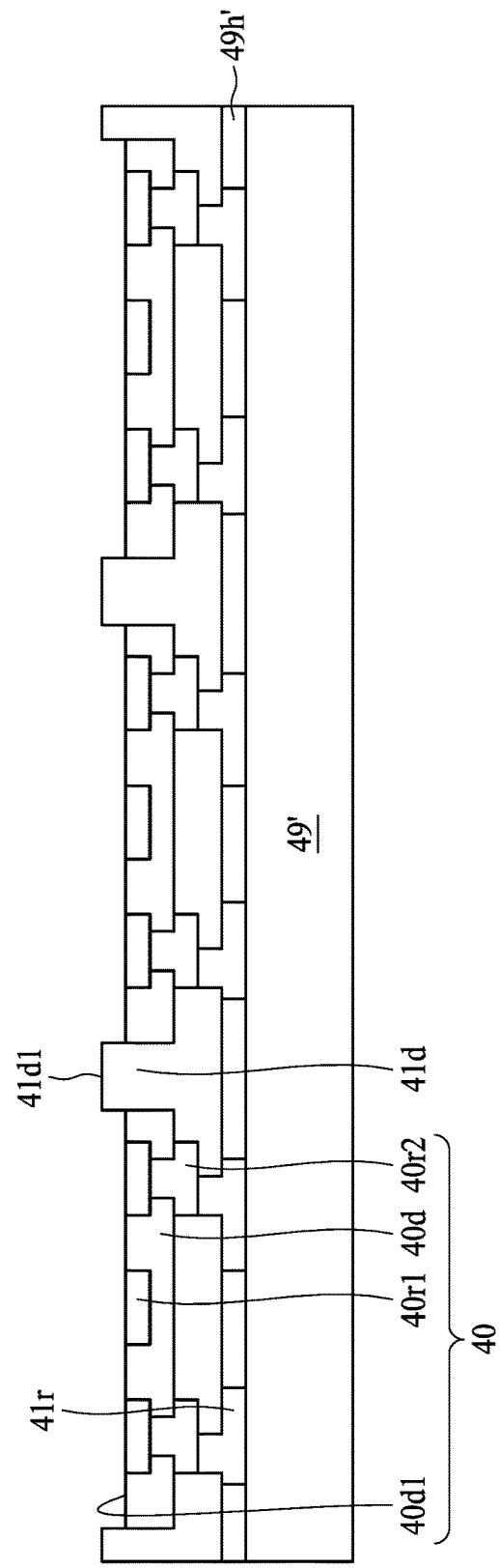
Figure 4E:
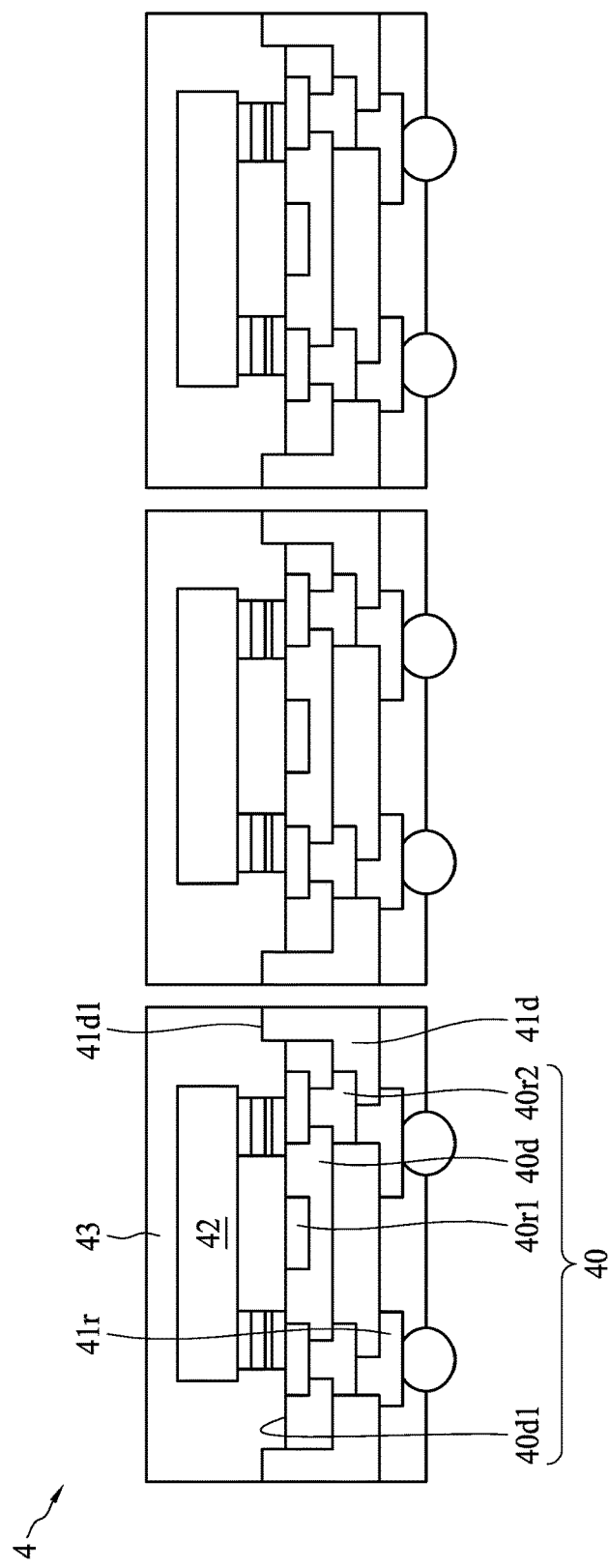

FIG. 4E illustrates a cross-sectional view of a plurality of semiconductor device package including a semiconductor device package 4 in accordance with some embodiments of the present disclosure. The semiconductor device package 4 includes a circuit layer 40, an electronic component 42 and a package body 43.

The circuit layer 40 may include conductive layers 40r1, 40r2 and 41r for providing electrical connections and dielectric layers 40d and 41d covering a portion of the conductive layers 40r1, 40r2 and 41r. In some embodiments, the dielectric layer 40d and/or the dielectric layer 41d includes a photosensitive material. In some embodiments, a top surface 40d1 of the dielectric layer 40d is lower than a top surface 41d1 of the dielectric layer 41d. For example, the top surface 40d1 of the dielectric layer 40d is recessed into the top surface 41d1 of the dielectric layer 41d.

The electronic component 42 is disposed on the circuit layer 40 and in contact with a portion of the conductive layer 40r1 that is exposed from the dielectric layer 40d. For example, the electronic component 42 is disposed within a recess defined by the dielectric layer 40d and the dielectric layer 41d. The package body 43 is disposed on the dielectric layers 40d and 41d to cover the conductive layer 40r1 and the electronic component 42.

FIGS. 3A, 3B, 3C, 3D, 3E, 3F, 3G, 3H and 3I are cross-sectional views of a semiconductor structure fabricated at various stages, in accordance with some embodiments of the present disclosure. Various figures have been simplified for a better understanding of the aspects of the present disclosure.

Figure 3A:
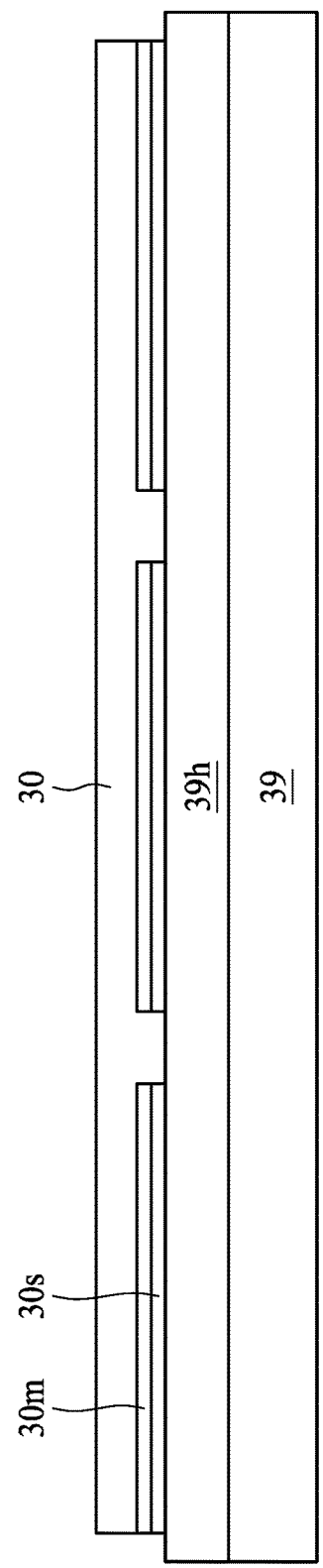
FIG. 3A, FIG. 3B, FIG. 3C, FIG. 3D, FIG. 3E, FIG. 3F, FIG. 3G, FIG. 3G', FIG. 3G"

Referring to FIG. 3A, a carrier 39 is provided and an adhesive layer (or release film) 39h is disposed on the carrier 39. A plurality of individual seed layers 30s and metal layers 30m are then formed on the adhesive layer 39h. In some embodiments, the seed layers 30s and metal layers 30m can be formed by the following operations: (i) disposing a seed layer and a metal layer on the adhesive layer 39h by, for example, physical vapor deposition (PVD); (ii) disposing a photoresist (e.g., mask) on the metal layer by, for example, coating process; and (iii) performing exposing, developing and etching process to separate the seed layer and the metal layer into several individual seed layers 30s and metal layers 30m. In some embodiments, the metal layer 30m and the seed layer 30s may include Ti, Cu or alloy(s). A dielectric layer 30 (or passivation layer) is then disposed on the metal layer 30m by, for example, coating process. In some embodiments, the dielectric layer 30 may have properties identical or similar to those of the dielectric layer 10 in FIG. 1A.

Figure 3B:
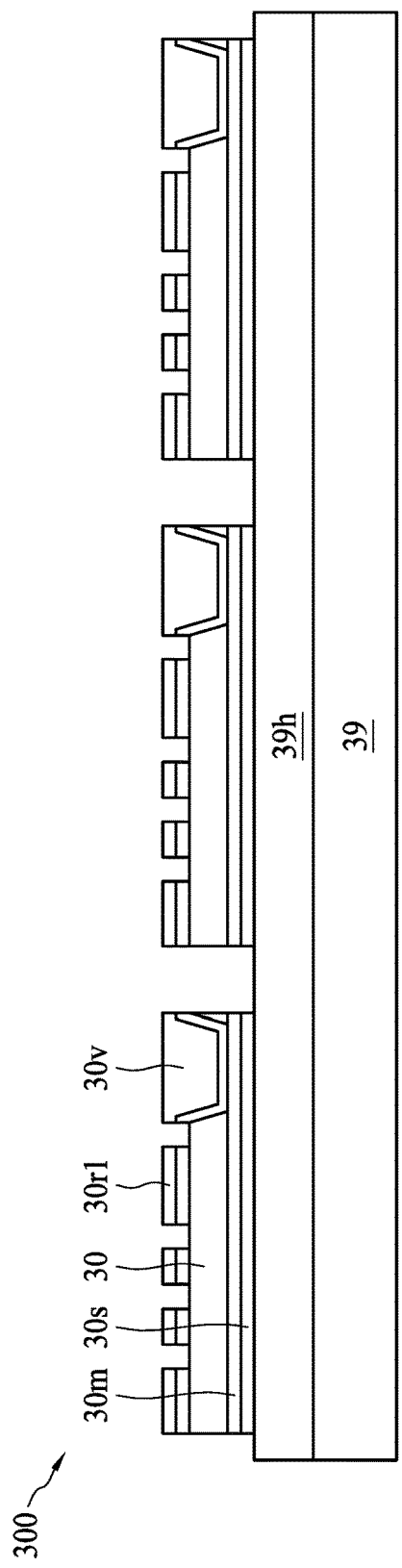

Referring to FIG. 3B, a conductive layer 30r1 is formed on the dielectric layer 30 and a conductive via 30v is formed to penetrate the dielectric layer 30 to be electrically connected to the metal layer 30m. In some embodiments, the patterned conductive layer 30r1 and the conductive via 30v can be formed by lithographic process. For example, the patterned conductive layer 30r1 and the conductive via 30v may be formed by the following operations: (i) performing developing process to form one or more openings on the dielectric layer 30; (ii) forming a metal layer (or metal layers) on the dielectric layer 30 and within the openings by, for example, PVD; (iii) disposing a photoresist (e.g., mask) on the metal layer by, for example, coating; and (iv) performing exposing, developing and etching process to form a plurality of openings on the photoresist to expose a portion of the metal layer; (v) filling the openings with metal by, for example, plating process; and (vi) removing the photoresist. In some embodiments, a portion of the dielectric layer 30 can be removed to form a plurality of interconnection structures 300.

Figure 3C:
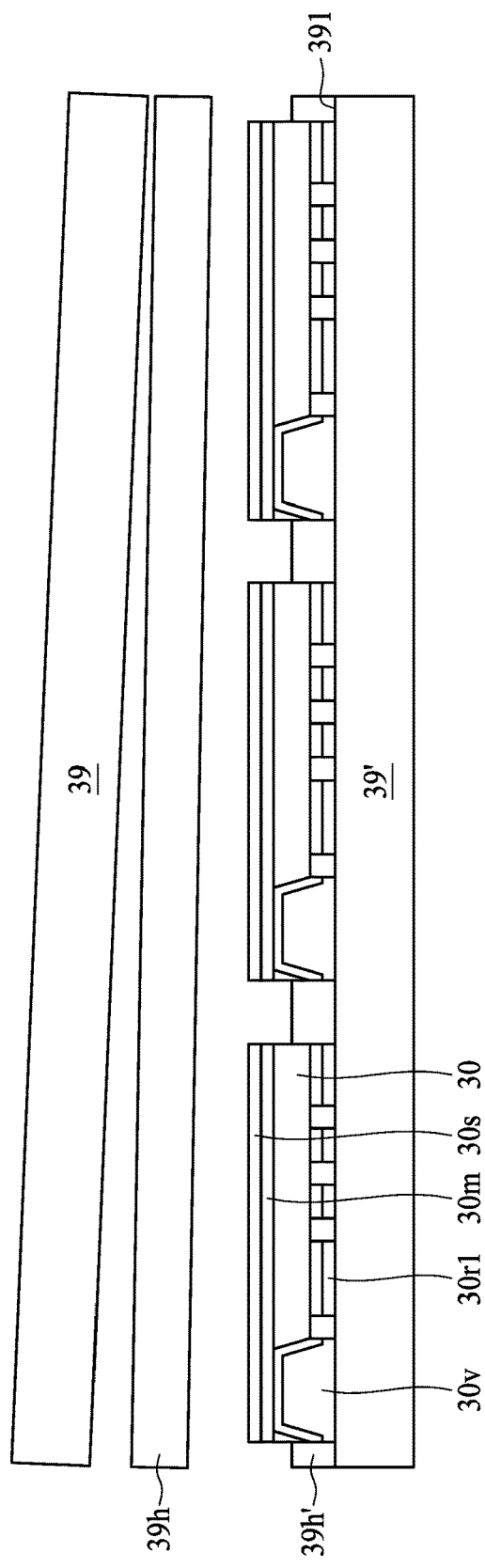

Referring to FIG. 3C, the carrier 39 and the adhesive layer 39h are removed from the interconnection structures 300. Then the interconnection structures 300 are attached to another carrier 39' having an adhesive layer 39h' thereon. In some embodiments, the adhesive layer 39h' is formed of or includes a soft adhesive material (e.g., glue), and the conductive layer 30r1 may sink into the adhesive layer 39h'. For example, the conductive layer 30r1 is embedded within the adhesive layer 39h'. For example, the conductive layer 30r1 may be substantially coplanar with a surface 391 of the carrier 39'. In some embodiments, the adhesive layer 39h' is disposed between a gap between two adjacent interconnection structures 300. In other embodiments, the adhesive layer 39h' may include a hard adhesive material, and the conductive layer 30r1 may be substantially coplanar with a surface of the adhesive layer 39h'. In this embodiment, a photoresist may be disposed within the gap between two adjacent interconnection structures 300

Figure 3D:
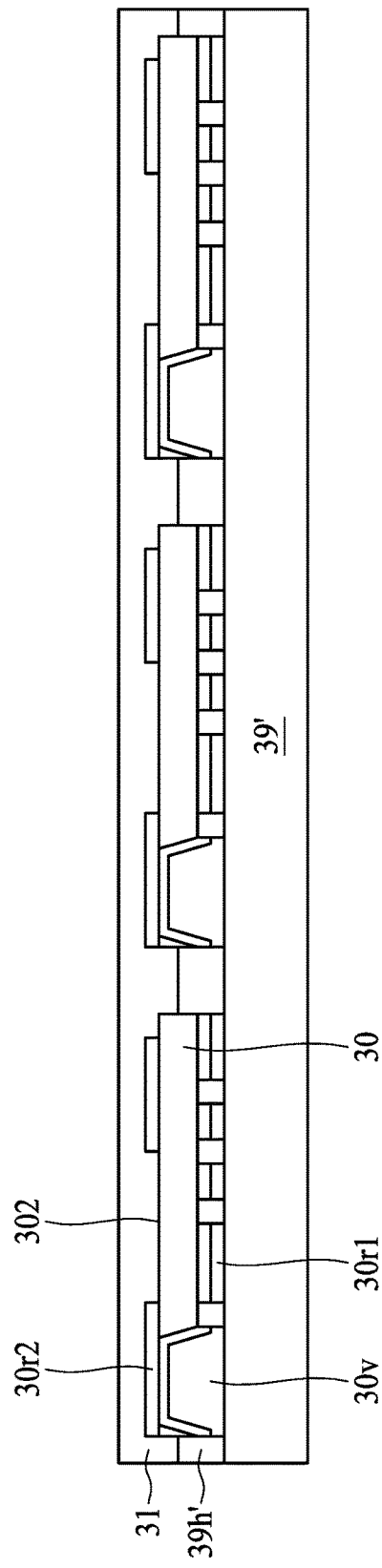

Referring to FIG. 3D, a conductive layer 30r2 is formed on a surface 302 of the dielectric layer 30. In some embodiments, the conductive layer 30r2 is electrically connected to the conductive via 30v. A dielectric layer 31 is disposed on the dielectric layer 30 to cover the conductive layer 30r2 by, for example, lamination. In some embodiments, the dielectric layer 31 is also disposed between the gap between two adjacent interconnection structures 300 and in contact with the adhesive layer 39h'. In some embodiments, the dielectric layer 31 may have properties identical or similar to those of the dielectric layer 11 in FIG. 1A. In some embodiments, the conductive layer 30r2 may be formed by the following operations: (i) removing the seed layer 30s by, for example, etching process to expose the metal layer 30m; (ii) disposing a photoresist (e.g., mask) on the metal layer 30m by, for example, coating; and (iv) performing exposing, developing and etching process to form a plurality of openings on the photoresist to expose a portion of the metal layer 30m; (v) removing the exposed portion of the metal layer 30m by, for example, etching process; and (vi) removing the photoresist.

Figure 3E:
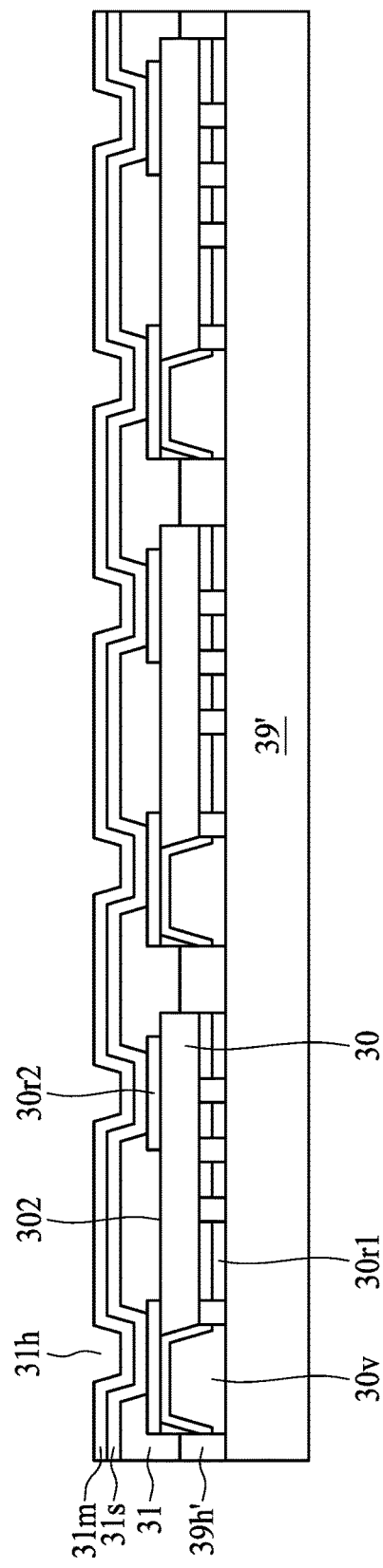

Referring to FIG. 3E, one or more openings 31h are formed to penetrate the dielectric layer 31 to expose a portion of the conductive layer 30r2 by lithographic process. A seed layer 31s and a metal layer 31m are formed on the dielectric layer 31 and extend within the openings 31h to be electrically connected to the conductive layer 30r2. In some embodiments, the seed layer 31s and the metal layer 31m can be formed by PVD.

Figure 3F:
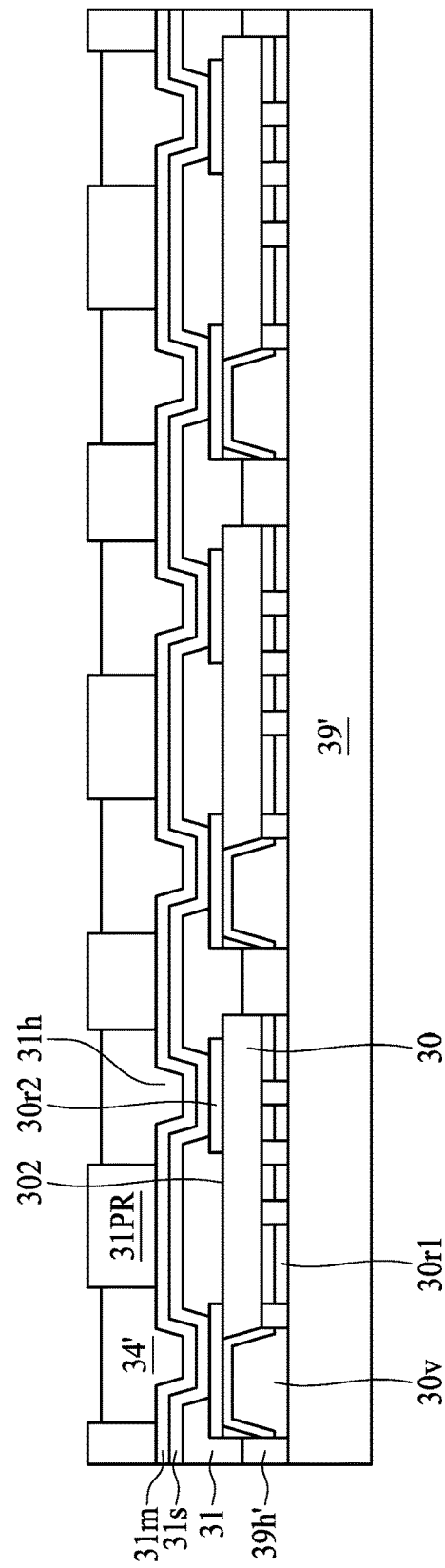

Referring to FIG. 3F, a photoresist 31PR is disposed on the metal layer 31m. One or more openings are formed on the photoresist 31PR to expose a portion of the metal layer 31m by, for example exposing, developing and etching processes. The openings are then filled by solders 34'. In some embodiments, the solders 34' can be formed by plating.

Figure 3G:
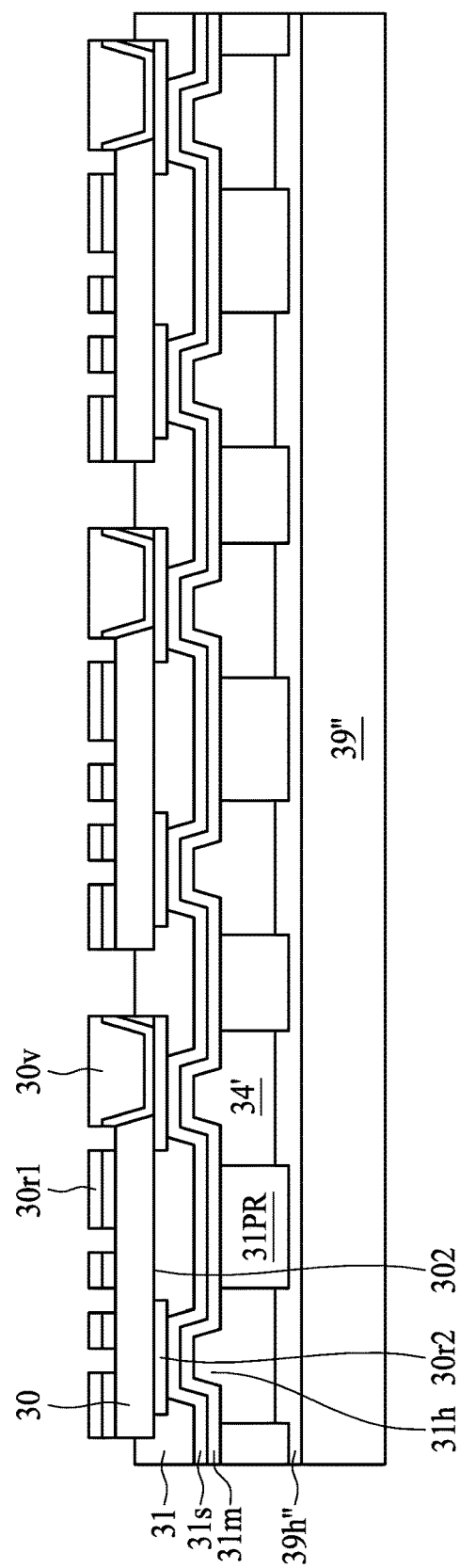
Figure 3G:
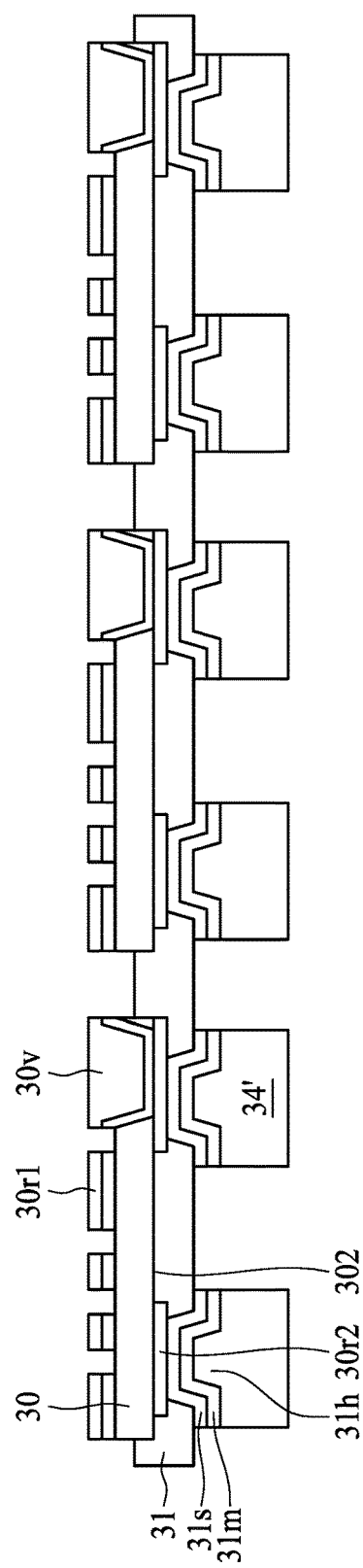

Referring to FIG. 3G, the carrier 39' and the adhesive layer 39h' are removed to expose the conductive layer 30r1 and the conductive via 30v. The photoresist 31PR and the solders 34' are attached to a carrier 39" having an adhesive layer 39h".

In some embodiments, as shown in FIG. 3G', after the operations in FIG. 3F, the carrier 39' and the adhesive layer 39h' are removed to expose the conductive layer 30r1 and the conductive via 30v. Then, the photoresist 31PR and a portion of the metal layer 31m and the seed layer 31s covered by the photoresist 31PR are removed as well. In some embodiments, the solder 34' can be removed as shown in FIG. 3G".

Figure 3H:
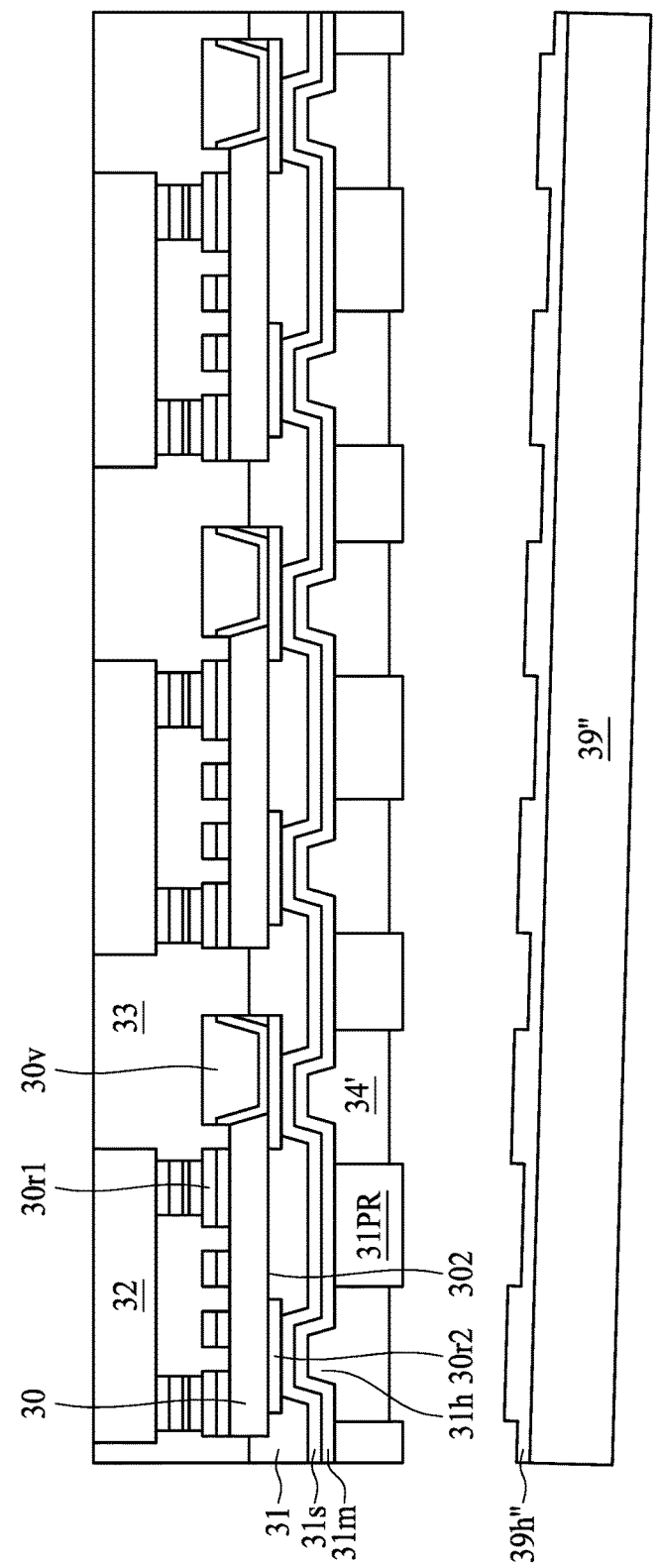
FIG. 3H and FIG. 3I illustrate a method of manufacturing a semiconductor device package in accordance with some embodiments of the present disclosure.

Referring to FIG. 3H, after the operations in FIG. 3G, an electronic component 32 is bonded to the conductive layer 30r1. A package body 33 is formed on the dielectric layers 30 and 31 to cover the conductive layer 30r1, the conductive via 30v and the electronic component 32. In some embodiments, the package body 33 can be formed by MUF process. The carrier 39" and the adhesive layer 39h" are then removed to expose the photoresist 31PR and solders 34'.

Figure 3I:
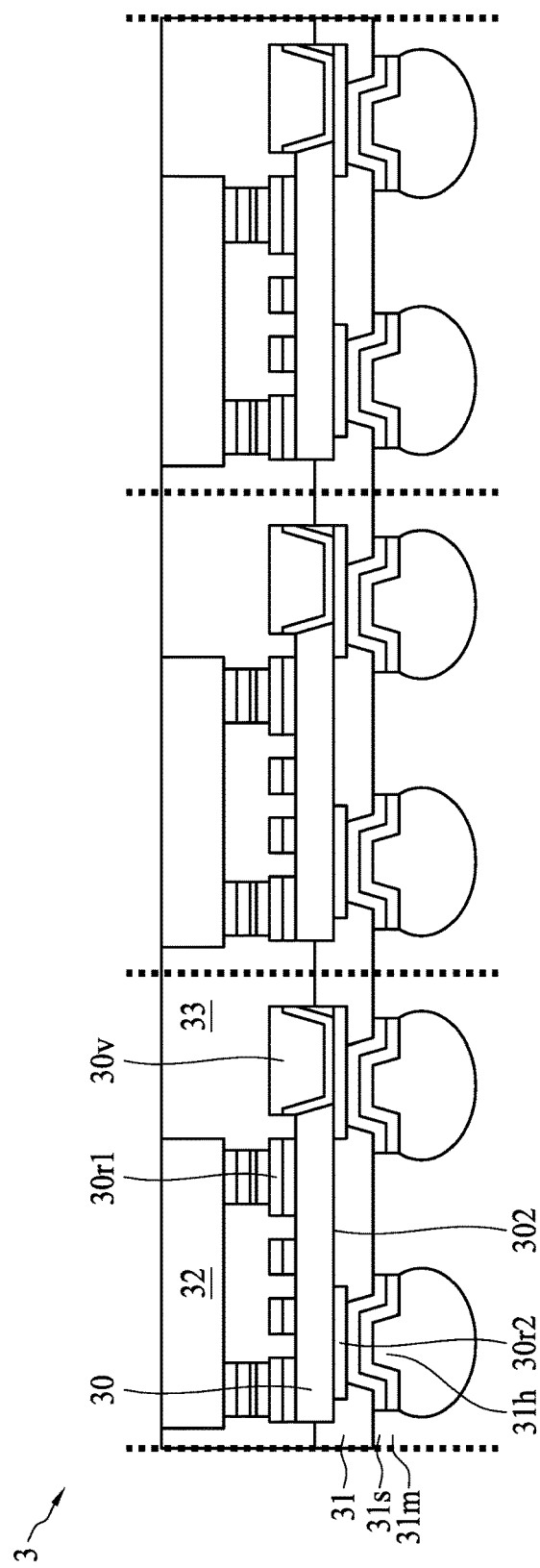

Referring to FIG. 3I, singulation may be performed to separate out individual semiconductor device packages including the semiconductor device package 3. That is, the singulation is performed through the package body 33 and the dielectric layer 31. The singulation may be performed, for example, by using a dicing saw, laser or other appropriate cutting technique. In some embodiments, the semiconductor device package 3 is similar to the semiconductor device package 1 in FIG. 1A.

FIGS. 4A, 4B, 4C, 4D and 4E are cross-sectional views of a semiconductor structure fabricated at various stages, in accordance with some embodiments of the present disclosure. Various figures have been simplified for a better understanding of the aspects of the present disclosure.

Referring to FIG. 4A, a carrier 49 with an adhesive layer 49h thereon is provided. A circuit layer 40 is formed at the adhesive layer 49h by lithographic process. The circuit layer 40 includes a seed layer 40s, a conductive layer 40r1 and a dielectric layer 40d (or a passivation layer) covering the seed layer 40s and the conductive layer 40r. In some embodiments, the dielectric layer 40d includes a photosensitive material.

Referring to FIG. 4B, a plurality of openings 40h1 and 40h2 are formed on the dielectric layer 40d by, for example, lithographic process (e.g., exposure, developing, etching and the like). In some embodiments, the opening 40h1 is formed to expose a portion of the conductive layer 40r1 and the opening 40h2 is formed to divide the circuit layer 40' as shown in FIG. 4A into a plurality of circuit layers 40. A shown in FIG. 4B, there is a gap between two adjacent circuit layers 40.

Referring to FIG. 4C, a conductive layer 40r2 is formed on the circuit layer 40 and within the opening 40h1 to be electrically connected to the conductive layer 40r1. A dielectric layer (or passivation layer) 41d is formed on the adhesive layer 49h to cover the circuit layer 40 and the conductive layer 40r2. One or more openings are formed on the dielectric layer 41d to expose a portion of the conductive layer 40r2, and then a conductive layer 41r is formed on the dielectric layer 41d and within the openings to be electrically connected to the conductive layer 40r2.

Referring to FIG. 4D, the dielectric layer 41d and the conductive layer 41r are attached to a carrier 49' having an adhesive layer 49h' thereon. The carrier 49 and the adhesive layer 49h are removed from the circuit layer 40. The seed layer 40s is then removed to expose the conductive layer 40r1. As shown in FIG. 4D, a conductive layer 40r1 is substantially coplanar with a surface 40d1 of the dielectric layer 40d. In some embodiments, the surface 40d1 of the dielectric layer 40d is recessed from the dielectric layer 40d.

For example, the surface 40d1 of the dielectric layer 40d is lower than a surface 41d1 of the dielectric layer 41d.

Referring to FIG. 4E, an electronic component 42 is bonded to the conductive layer 40r1. A package body 43 is formed on the dielectric layers 40d and 41d to cover the conductive layer 40r1 and the electronic component 42. The carrier 49' and the adhesive layer 49h' are then removed. Singulation may be performed to separate out individual semiconductor device packages including the semiconductor device package 4. That is, the singulation is performed through the package body 43 and the dielectric layer 41d. The singulation may be performed, for example, by using a dicing saw, laser or other appropriate cutting technique.

Figure 5B:
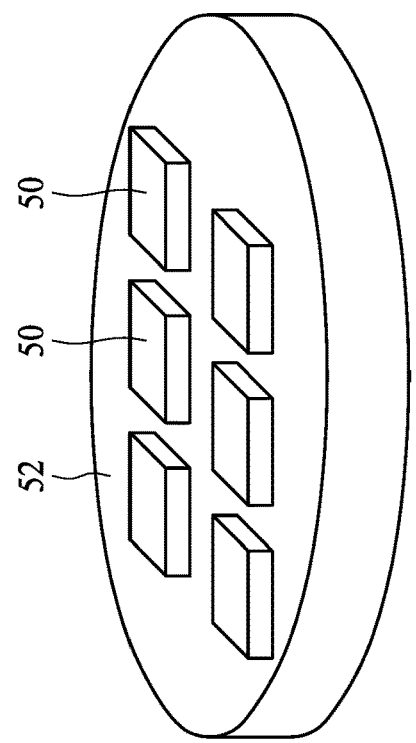
FIG. 5B illustrates various types of semiconductor device packages in accordance with some embodiments of the present disclosure.
Figure 5A:
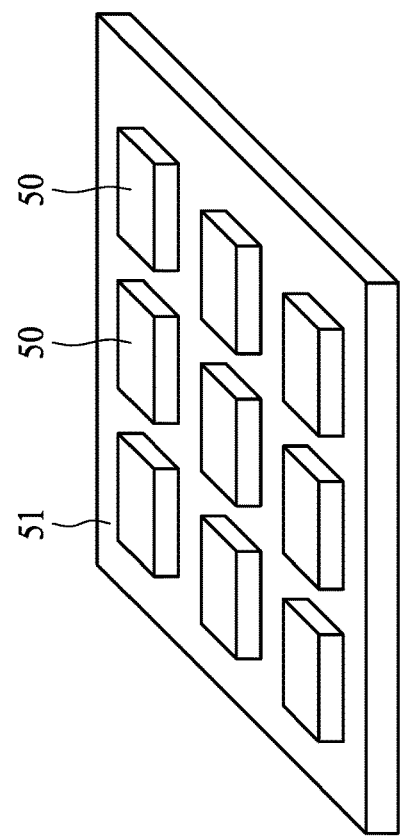
FIG. 5A illustrates various types of semiconductor device packages in accordance with some embodiments of the present disclosure.

FIGS. 5A and 5B illustrate different types of semiconductor device packages in accordance with some embodiments of the present disclosure.

As shown in FIG. 5A, a plurality of chips 50 and/or dies are placed on a square-shaped carrier 51. In some embodiments, at least one of the chips 50 may include the semiconductor device package 1, 2A, 2B, 2C or 4 as show in FIG. 1A, 2A, 2B, 2C or 4E. In some embodiments, the carrier 51 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As shown in FIG. 5B, a plurality of chips 50 and/or dies are placed on a circle-shaped carrier 52. In some embodiments, at least one of the chips 50 may include the semiconductor device package 1, 2A, 2B, 2C or 4 as show in FIG. 1A, 2A, 2B, 2C or 4E. In some embodiments, the carrier 52 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:
1. A semiconductor device package, comprising:
a first dielectric layer having a top surface, a bottom surface opposite to the top surface and a lateral surface extending between the top surface and the bottom surface;
a first conductive layer disposed on the top surface of the first dielectric layer;
an electronic component disposed on the top surface of the first dielectric layer;
a second dielectric layer covering the bottom surface and a first portion of the lateral surface of the first dielectric layer and exposing a second portion of the lateral surface of the first dielectric layer;

a second conductive layer disposed on a bottom surface of the second dielectric layer and electrically connected to the first conductive layer; and a package body covering the electronic component, the top surface of the second dielectric layer and the second portion of the lateral surface of the first dielectric layer.

2. The semiconductor device package of claim 1, wherein the top surface of the first dielectric layer and the top surface of the second dielectric layer are discontinuous.

3. The semiconductor device package of claim 1, wherein the first conductive layer includes a plurality conductive traces and a line space (L/S) of the conductive traces is equal to or less than 2/2 micrometer (µm).

4. The semiconductor device package of claim 1, wherein the first dielectric layer includes a photosensitive material.

5. The semiconductor device package of claim 1, further comprising a third conductive layer disposed on the bottom surface of the first dielectric layer.

6. The semiconductor device package of claim 5, further comprising a first conductive via electrically connecting the first conductive layer to the third conductive layer and a second conductive via electrically connecting the second conductive layer to the third conductive layer.

7. The semiconductor device package of claim 6, wherein the first conductive via tapers in a direction away from the electronic component and the second conductive via tapers in a direction toward the electronic component.

8. The semiconductor device package of claim 1, wherein the second dielectric layer has a lateral surface;

a distance between the lateral surface of the first dielectric layer and the lateral surface of the second dielectric layer varies; and a difference between a maximum distance from the lateral surface of the first dielectric layer to the lateral surface of the second dielectric layer and a minimum distance from the lateral surface of the first dielectric layer to the lateral surface of the second dielectric layer is less than or equal to 1 µm.

9. The semiconductor device package of claim 1, wherein an interface between the second dielectric layer and the package body is not coplanar with the top surface of the first dielectric layer.

10. The semiconductor device package of claim 1, wherein an interface between the second dielectric layer and the package body is not coplanar with an interface between the first dielectric layer and the second dielectric layer.

11. The semiconductor device package of claim 1, wherein the first dielectric layer has a first portion embedded within the second dielectric layer and a second portion embedded within the package body.

12. The semiconductor device package of claim 1, further comprising a first conductive via extending from the top surface of the first dielectric layer to the bottom surface of the first dielectric layer.

13. A semiconductor device package, comprising:

a first circuit layer having a first dielectric layer and a first conductive layer;

a second circuit layer having a second dielectric layer covering at least a portion of the first dielectric layer and a second conductive layer electrically connected to the first conductive layer;

an electronic component disposed on the first circuit layer; and a package body covering the electronic component, the first circuit layer and the second circuit layer, wherein $0<|A-B|\leq 1$ micrometer (µm), where A is a maximum distance between a lateral surface of the first dielectric layer and a lateral surface of the second dielectric layer and B is a minimum distance between the lateral surface of the first dielectric layer and the lateral surface of the second dielectric layer.

14. The semiconductor device package of claim 13, wherein the first conductive layer includes a plurality conductive traces and a line space (L/S) of the conductive traces is equal to or less than 2/2 µm.

15. The semiconductor device package of claim 13, wherein the first dielectric layer includes a photosensitive material.

16. The semiconductor device package of claim 13, wherein an interface between the second dielectric layer and the package body is on the lateral surface of the first dielectric layer.

17. The semiconductor device package of claim 13, wherein the first circuit layer has a first portion embedded within the second circuit layer and a second portion exposed from the second circuit layer and protruded from the second circuit layer.

18. The semiconductor device package of claim 13, further comprising a first conductive via connected between the second conductive layer and the first conductive layer.

19. The semiconductor device package of claim 13, wherein the package body covers a first portion of the lateral surface of the first dielectric layer and exposes a second portion of the lateral surface of the first dielectric layer.

20. The semiconductor device package of claim 19, wherein the second dielectric layer exposes the first portion of the lateral surface of the first dielectric layer and covers the second portion of the lateral surface of the first dielectric layer.

* * * * *